United States Patent
Utamaru

(10) Patent No.: US 8,406,283 B2
(45) Date of Patent: Mar. 26, 2013

(54) MODULATION APPARATUS, TEST APPARATUS AND CORRECTION METHOD

(75) Inventor: Go Utamaru, Ibaraki (JP)

(73) Assignee: Advantest Corporation, Tokyo (JP)

( * ) Notice: Subject to any disclaimer, the term of this patent is extended or adjusted under 35 U.S.C. 154(b) by 713 days.

(21) Appl. No.: 12/505,804

(22) Filed: Jul. 20, 2009

(65) Prior Publication Data

US 2011/0013682 A1   Jan. 20, 2011

(51) Int. Cl.
   *H04B 3/46*   (2006.01)
   *H04L 27/36*   (2006.01)
   *H01Q 11/12*   (2006.01)

(52) U.S. Cl. .............. 375/224; 375/298; 455/126

(58) Field of Classification Search .............. 375/224, 375/298
   See application file for complete search history.

(56) References Cited

U.S. PATENT DOCUMENTS

| | | | |
|---|---|---|---|
| 4,758,880 A * | 7/1988 | McFetridge | 348/517 |
| 4,769,692 A * | 9/1988 | McFetridge | 348/520 |
| 6,016,422 A * | 1/2000 | Bartusiak | 455/76 |
| 6,298,096 B1 * | 10/2001 | Burgin | 375/296 |
| 6,618,096 B1 * | 9/2003 | Stapleton | 348/608 |
| 2004/0155707 A1 * | 8/2004 | Kim et al. | 330/149 |
| 2004/0162038 A1 * | 8/2004 | Kanazawa et al. | 455/126 |
| 2007/0140378 A1 | 6/2007 | Kato | |
| 2007/0253510 A1 * | 11/2007 | Danz | 375/298 |
| 2007/0258534 A1 * | 11/2007 | Schmidt | 375/262 |
| 2008/0166985 A1 * | 7/2008 | Wortel et al. | 455/233.1 |
| 2009/0221247 A1 * | 9/2009 | Poloni | 455/115.2 |

FOREIGN PATENT DOCUMENTS

JP   2005-244358 A   9/2005

* cited by examiner

*Primary Examiner* — David C. Payne
*Assistant Examiner* — Sarah Hassan

(57) ABSTRACT

Provided is a modulation apparatus that quadrature modulates a periodic signal, comprising an I-side signal output section that outputs an I-component signal; a Q-side signal output section that outputs a Q-component signal; a quadrature modulator that quadrature modulates the periodic signal with the I-component signal and the Q-component signal; an I-side correcting section that corrects the I-component signal according to an error of the quadrature modulator; and a Q-side correcting section that corrects the Q-component signal according to the error of the quadrature modulator.

9 Claims, 8 Drawing Sheets

MODULATION APPARATUS, TEST APPARATUS AND CORRECTION METHOD

BACKGROUND

1. Technical Field

The present invention relates to a modulation apparatus, a test apparatus, and a correction method.

2. Related Art

Japanese Patent Application Publication No. 2005-244358 discloses a method for measuring error of a quadrature modulator.

In recent years, quadrature modulators with high speed and high precision are greatly desired. When using a high-speed high-precision quadrature modulator, it is necessary to adjust the accuracy using an adjustment circuit before using the quadrature modulator. However, since the quadrature modulator is an analog circuit, providing the adjustment circuit increases the overall circuit size. Furthermore, the quadrature modulator requires a longer time for adjustment when there are many adjustments to be made.

SUMMARY

Therefore, it is an object of an aspect of the innovations herein to provide a modulation apparatus, a test apparatus, and a correction method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary modulation apparatus may include a modulation apparatus that quadrature modulates a periodic signal, comprising an I-side signal output section that outputs an I-component signal; a Q-side signal output section that outputs a Q-component signal; a quadrature modulator that quadrature modulates the periodic signal with the I-component signal and the Q-component signal; an I-side correcting section that corrects the I-component signal according to an error of the quadrature modulator; and a Q-side correcting section that corrects the Q-component signal according to the error of the quadrature modulator.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
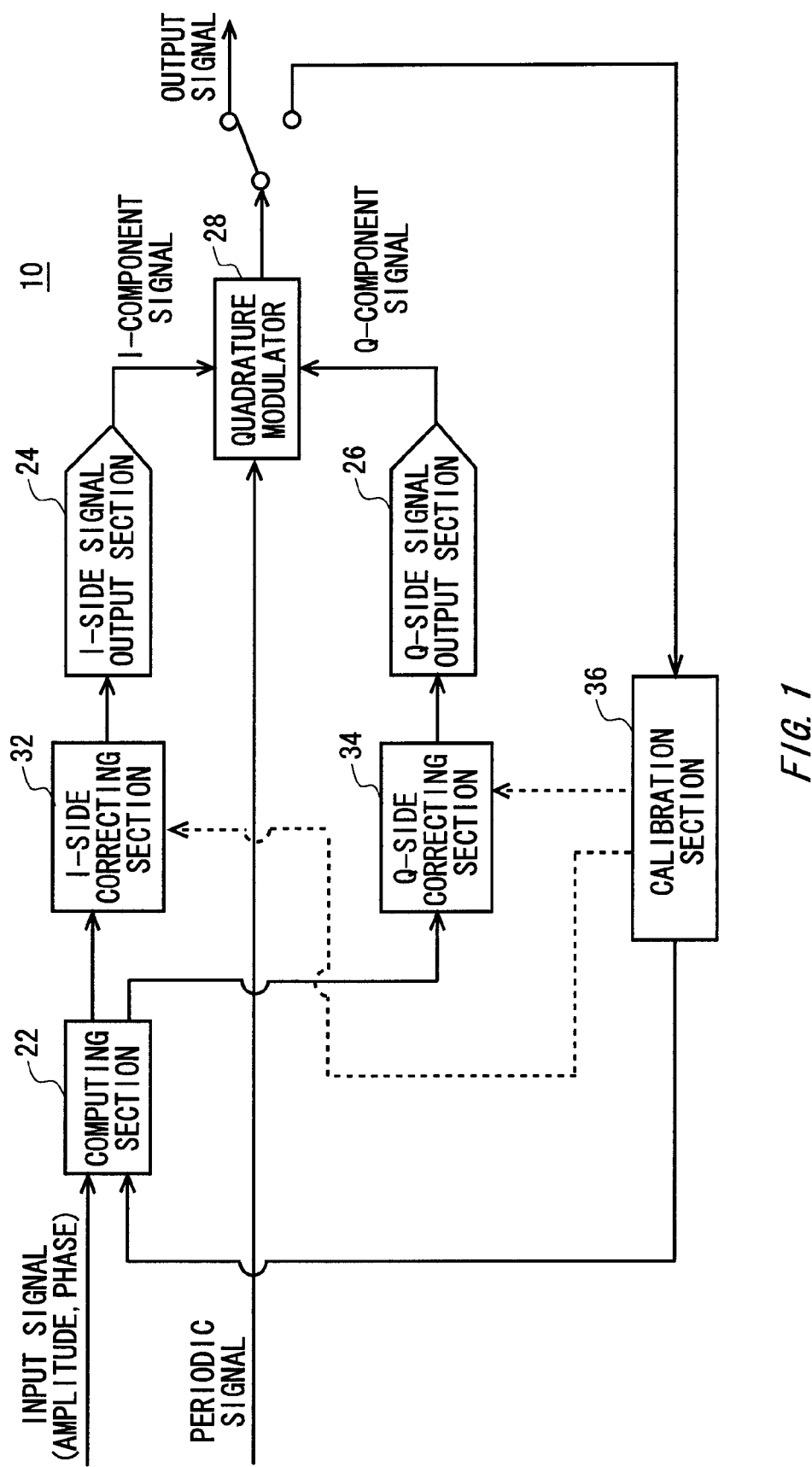
FIG. 1 shows a configuration of a modulation apparatus 10 according to an embodiment of the present invention.

FIG. 1 shows a configuration of a modulation apparatus 10 according to an embodiment of the present invention. The modulation apparatus 10 quadrature modulates a periodic signal with an input signal, such as a baseband IQ signal.

The modulation apparatus 10 is provided with a computing section 22, an I-side signal output section 24, a Q-side signal output section 26, a quadrature modulator 28, an I-side correcting section 32, a Q-side correcting section 34, and a calibration section 36.

The computing section 22 is supplied with the input signal, such as the baseband IQ signal, from the outside, and this input signal designates an amplitude and a phase. The computing section 22 outputs I-component data expressing the designated amplitude and phase as a real number component and Q-component data expressing the designated amplitude and phase as an imaginary number component.

The I-side correcting section 32 corrects the I-component signal according to an error of the quadrature modulator 28 measured by the calibration section 36. In the present embodiment, the I-side correcting section 32 receives the I-component data from the computing section 22, corrects the received I-component data using a computational process, and supplies the corrected I-component data to the I-side signal output section 24. The I-side correcting section 32 may correct the received I-component data by converting this data according to a correction table or the like.

The Q-side correcting section 34 corrects the Q-component signal according to an error of the quadrature modulator 28 measured by the calibration section 36. In the present embodiment, the Q-side correcting section 34 receives the Q-component data from the computing section 22, corrects the received Q-component data using a computational process, and supplies the corrected Q-component data to the Q-side signal output section 26. The Q-side correcting section 34 may correct the received Q-component data by converting this data according to a correction table or the like.

The I-side signal output section 24 outputs an I-component signal corresponding to the I-component data corrected by the I-side correcting section 32. For example, the I-side signal output section 24 outputs an analog I-component signal with a voltage or power proportional to the I-component data corrected by the I-side correcting section 32. The I-side signal output section 24 may be a DA converter that performs a digital-analog conversion on the I-component data corrected by the I-side correcting section 32.

The Q-side signal output section 26 outputs a Q-component signal corresponding to the Q-component data corrected by the Q-side correcting section 34. For example, the Q-side signal output section 26 outputs an analog Q-component signal with a voltage or power proportional to the Q-component data corrected by the Q-side correcting section 34. The Q-side signal output section 26 may be a DA converter that performs a digital-analog conversion on the Q-component data corrected by the Q-side correcting section 34.

The quadrature modulator 28 quadrature modulates a periodic signal supplied thereto with the I-component signal and the Q-component signal. More specifically, the quadrature modulator 28 amplitude modulates the I-component signal with a sine signal having the same period as the periodic signal, and amplitude modulates the Q-component signal with a cosine signal having a phase delayed 90 degrees from that of the sine signal. The quadrature modulator 28 generates an output signal by adding together the sine signal amplitude modulated by the I-component signal and the cosine signal amplitude modulated by the Q-component signal. The specific configuration of the quadrature modulator 28 is described further in relation to FIG. 2.

The calibration section 36 measures an error of the quadrature modulator 28. For example, the calibration section 36 measures at least one of an origin offset, a quadrature error, and an amplitude error of the quadrature modulator 28. The calibration section 36 calculates correction amounts for the correction processes performed by the I-side correcting section 32 and the Q-side correcting section 34, based on the measured error. The calibration section 36 sets the correction amounts corresponding to the measured error in the I-side correcting section 32 and the Q-side correcting section 34.

The calibration section 36 may measure the error of the quadrature modulator 28 by receiving the output signal from the quadrature modulator 28 via a switch. Instead, the calibration section 36 may measure the error of the quadrature modulator 28 by receiving the output signal from the quadrature modulator 28 via a signal distributor. A specific description of the configuration of the calibration section 36 is provided in relation to FIG. 4.

The modulation apparatus 10 may be directly supplied with the I-component data and the Q-component data from the outside. In this case, the modulation apparatus 10 need not include the computing section 22. Instead of the receiving the I-component data from the computing section 22, the I-side correcting section 32 receives the I-component data directly from the outside. Instead of the receiving the Q-component data from the computing section 22, the Q-side correcting section 34 receives the Q-component data directly from the outside.

The modulation apparatus 10 may directly designate the amplitude and phase for the I-side correcting section 32 and the Q-side correcting section 34. In this case, the modulation apparatus 10 need not include the computing section 22. The I-side correcting section 32 calculates the corrected I-component data directly from the designated amplitude and phase. The Q-side correcting section 34 calculates the corrected Q-component data directly from the designated amplitude and phase.

If the designated amplitude is constant, the modulation apparatus 10 functions as a phase shifting apparatus. In this case, instead of receiving the phase from the outside, the modulation apparatus 10 may receive a delay time from the outside. In this case, the computing section 22 receives the delay time along with the period of the periodic signal, and calculates a phase of the periodic signal corresponding to the received delay time. The computing section 22 then calculates the I-component data and the Q-component data having the calculated phase.

Figure 2:
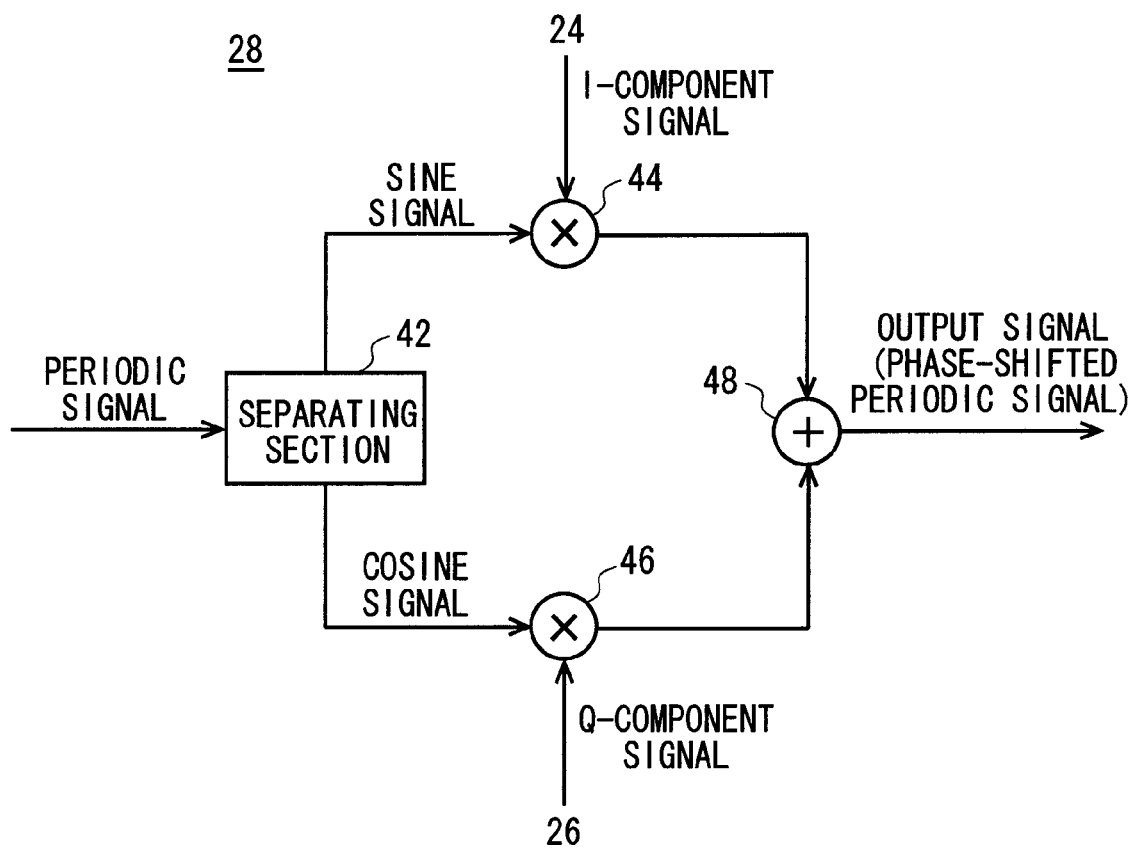
FIG. 2 shows a configuration of the quadrature modulator 28 according to the present embodiment.

FIG. 2 shows a configuration of the quadrature modulator 28 according to the present embodiment. The quadrature modulator 28 includes a separating section 42, an I-side multiplier 44, a Q-side multiplier 46, and an in-modulator adder 48.

The separating section 42 separates the periodic signal into a sine signal having the same period as the periodic signal and a cosine signal having a phase delayed by 90 degrees from that of the sine signal. The separating section 42 may be any of a variety of circuits, such as a poly-phase filter, a circuit that divides a clock having a double period to generate two signals differing in phase by 90 degrees, or the like.

The I-side multiplier 44 multiplies the sine signal by the I-component signal output by the I-side signal output section 24. The Q-side multiplier 46 multiplies the cosine signal by the Q-component signal output by the Q-side signal output section 26. The in-modulator adder 48 outputs, as the output signal, a signal obtained by adding together the signal output from the I-side multiplier 44 and the signal output from the Q-side multiplier 46.

If the sine signal and the cosine signal output by the separating section 42 are square-wave clock signals whose levels are limited by a limiting amplifier or the like, the I-side multiplier 44 and the Q-side multiplier 46 output staircase signals corresponding to the levels of the I-component signal and the Q-component signal supplied thereto. In this case, the quadrature modulator 28 may be further provided with a low-pass filter for waveform shaping at a stage after the in-modulator adder 48, and may remove a high-frequency component of the output signal.

It should be noted that the output signal of the quadrature modulator 28 includes an error. The error in the output signal of the quadrature modulator 28 includes an amplitude error, a quadrature error, and an origin offset.

The amplitude error of the quadrature modulator 28 represents a ratio of the actual amplitude to the amplitude of an ideal output signal. The quadrature error represents a phase difference between the sine signal and the cosine signal resulting from the separation by the separating section 42. The origin offset represents an output signal that is output when the I-component signal and the Q-component signal are 0.

Here, the I-component, i.e. the real number component, of the amplitude error is represented by "$m_i$," the Q-component, i.e. the imaginary number component, of the amplitude error is represented by "$m_q$," the quadrature error is represented by "$\theta_{re}$," the amplitude component of the origin offset is represented by "d," and the phase component of the origin offset is represented by "$\phi$." In this case, the output signal Y(t) including the error of the quadrature modulator 28 is represented by Expression 3 below.

$$Y(t)=mq \times i \times \sin(\omega t+\theta re)+mi \times q \times \cos(\omega t)+d \times \cos(\omega t+\phi) \quad \text{Expression 3:}$$

Figure 3:
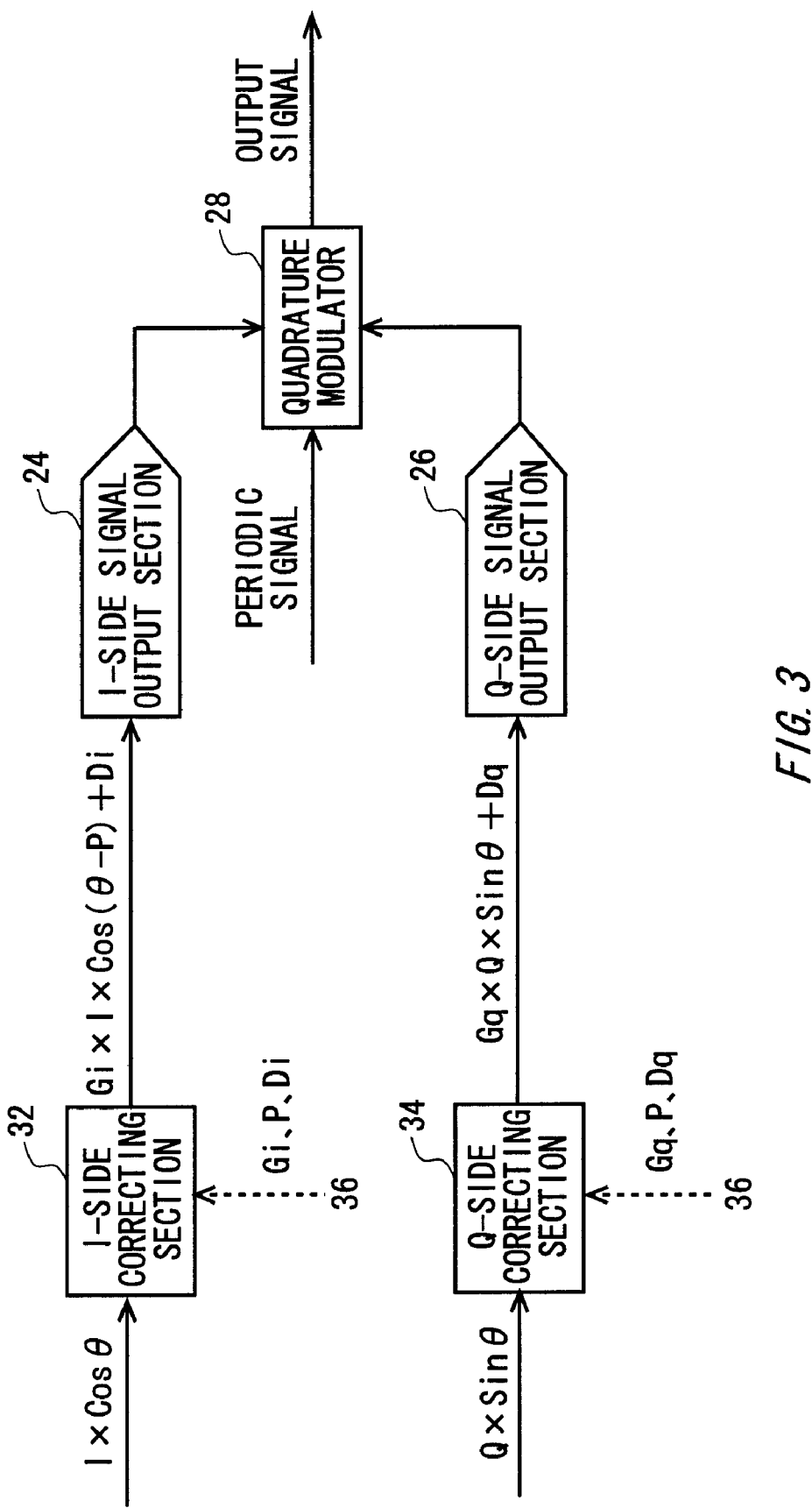
FIG. 3 shows an exemplary correction computation performed by the I-side correcting section 32 and the Q-side correcting section 34 according to the present embodiment.

FIG. 3 shows an exemplary correction computation performed by the I-side correcting section 32 and the Q-side correcting section 34 according to the present embodiment. The modulation apparatus 10 of the present embodiment corrects the I-component data (I×cos($\theta$)) representing the real number component of the input signal, e.g. a baseband IQ signal, and the Q-component data (Q×Sin($\theta$)) representing the imaginary number component of the input signal, according to the amplitude error, the quadrature error, and the origin offset of the quadrature modulator 28.

More specifically, the I-side correcting section 32 corrects the gain of the I-component data (I×cos($\theta$)) having the designated amplitude (I) and phase ($\theta$) by a correction amount (Gi) corresponding to the I-component of the amplitude error of the quadrature modulator 28, and supplies the corrected I-component data to the I-side signal output section 24. For example, the I-side correcting section 32 may supply the I-side signal output section 24 with a value (Gi×I×cos(θ)) obtained by multiplying the I-component data by the correction amount representing the inverse of the I-component of the amplitude error.

The Q-side correcting section 34 may correct the gain of the Q-component data (Q×sin(θ)) having the designated amplitude (Q) and phase (θ) by a correction amount (Gq) corresponding to the Q-component of the amplitude error of the quadrature modulator 28, and supplies the corrected Q-component data to the Q-side signal output section 26. For example, the Q-side correcting section 34 may supply the Q-side signal output section 26 with a value (Gq×Q×sin(θ)) obtained by multiplying the Q-component data by the correction amount representing the inverse of the Q-component of the amplitude error.

In this way, the I-side correcting section 32 and the Q-side correcting section 34 can cause the quadrature modulator 28 to output an output signal from which the effect of the amplitude error is removed. The I-side correcting section 32 and the Q-side correcting section 34 need not set the I-component and the Q-component of the output signal to have the ideal amplitude, as long as the amplitudes of the I-component and the Q-component are corrected to be the same as each other.

At least one of the I-side correcting section 32 and the Q-side correcting section 34 corrects the designated phase (θ) by a correction amount (p) according to the quadrature error of the quadrature modulator 28. For example, the I-side correcting section 32 may supply the I-side signal output section 24 with I-component data (I×cos(θ−p)) obtained by multiplying the designated amplitude (I) by the cosine value (cos(θ−p)) of the corrected phase (θ−p), which is a result of the correction amount being subtracted from the designated phase. In this case, the correction amount (p) may be the quadrature error of the quadrature modulator 28. Furthermore, the Q-side correcting section 34 need not correct the designated phase (θ) according to the quadrature error.

Instead, the Q-side correcting section 34 may supply the Q-side signal output section 26 with Q-component data (Q×sin(θ+p)) obtained by multiplying the designated amplitude (Q) by the sine value (sin(θ+p)) of the corrected phase (θ+p), which is a result of the correction amount, e.g. the quadrature error, being added to the designated phase. In this case, I-side correcting section 32 need not correct the designated phase (θ) according to the quadrature error. In this way, the I-side correcting section 32 and the Q-side correcting section 34 can cause the quadrature modulator 28 to output an output signal from which the effect of the quadrature error is removed.

The I-side correcting section 32 may correct the offset added to the I-component data (I×cos(θ)) by using a correction amount (Di) corresponding to the I-component of the origin offset of the quadrature modulator 28. For example, the I-side correcting section 32 supplies the I-side signal output section 24 with a value (I×cos(θ)+Di) obtained by adding the I-component of the origin offset of the quadrature modulator 28 to the I-component data.

The Q-side correcting section 34 may correct the offset added to the Q-component data (Q×sin(θ)) by using a correction amount (Dq) corresponding to the Q-component of the origin offset of the quadrature modulator 28. For example, the Q-side correcting section 34 supplies the Q-side signal output section 26 with a value (Q×sin(θ)+Dq) obtained by adding the Q-component of the origin offset of the quadrature modulator 28 to the Q-component data.

The I-side correcting section 32 may perform the above corrections as a set. In this case, the I-side correcting section 32 supplies the I-side signal output section 24 with a value (I_DAC_Setting) shown by Expression 4 below.

$$I\_DAC\_Setting = Gi \times I \times \cos(\theta - p) + Di \qquad \text{Expression 4:}$$

The Q-side correcting section 34 may also perform the above corrections as a set. In this case, the Q-side correcting section 34 supplies the Q-side signal output section 26 with a value (Q_DAC_Setting) shown by Expression 5 below.

$$Q\_DAC\_Setting = Gq \times Q \times \sin(\theta) + Dq \qquad \text{Expression 5:}$$

As described above, the modulation apparatus 10 according to the present embodiment can output an accurate output signal from the quadrature modulator 28 by correcting the I-component signal and the Q-component signal supplied to the quadrature modulator 28. In particular, since the correction is performed at a stage prior to the I-side signal output section 24 and the Q-side signal output section 26, the modulation apparatus 10 can use a digital circuit to adjust the quadrature modulator 28. As a result, the circuit size of the adjustment circuit is decreased, and the adjustment is simplified.

The correction method described above is just one example. The modulation apparatus 10 may correct the I-component data and the Q-component data according to the error of the quadrature modulator 28 using a different correction method in which the correction is performed at a stage prior to the I-side signal output section 24 and the Q-side signal output section 26.

Figure 4:
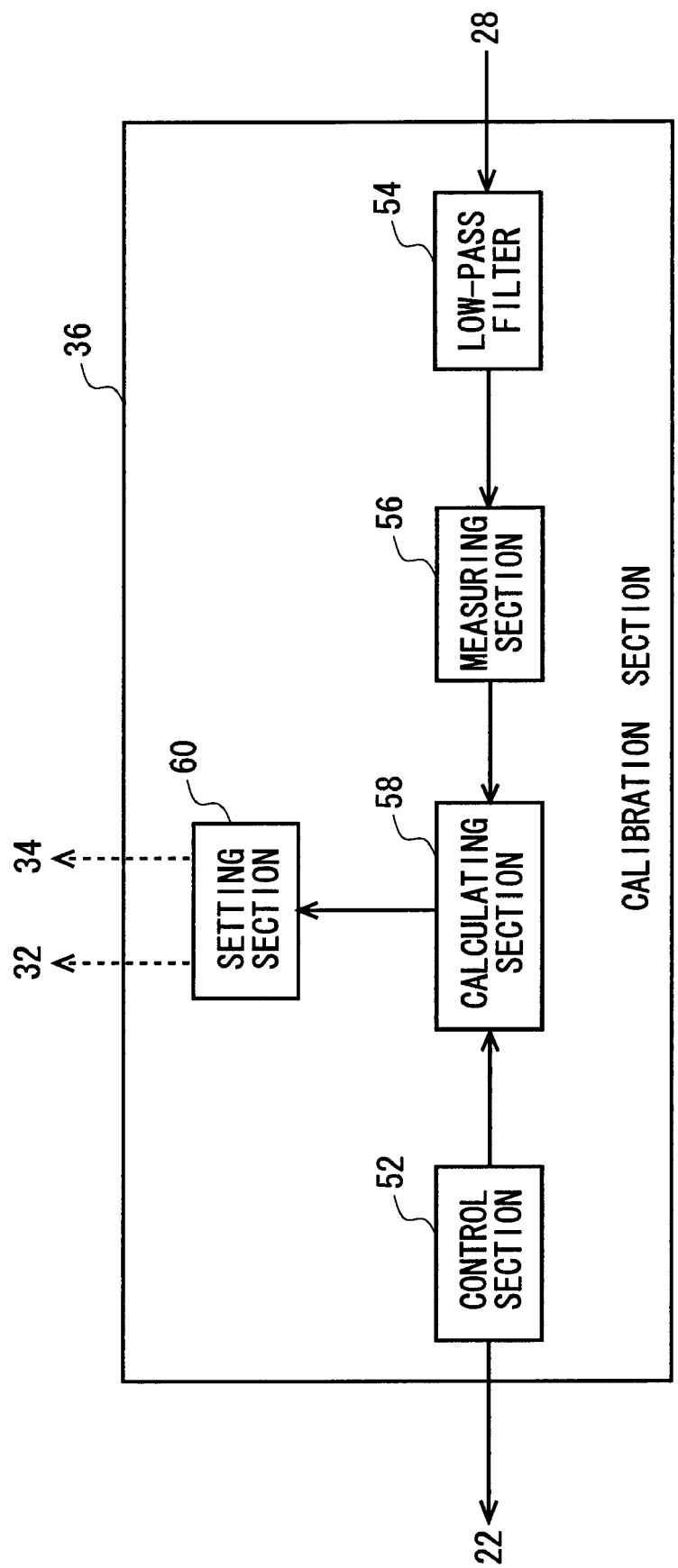
FIG. 4 shows a configuration of the calibration section 36 according to the present embodiment.

FIG. 4 shows a configuration of the calibration section 36 according to the present embodiment. During calibration, the calibration section 36 measures the amplitude error, the quadrature error, and the origin offset of the quadrature modulator 28. The calibration section 36 calculates correction amounts based on these measurements, and sets the correction amounts in the I-side correcting section 32 and the Q-side correcting section 34.

The calibration section 36 includes a control section 52, a low-pass filter 54, a measuring section 56, a calculating section 58, and a setting section 60.

The control section 52 supplies the computing section 22 with a signal having a predetermined amplitude and phase, so that (i) the I-side signal output section 24 outputs the I-component signal corresponding to the I-component data having the predetermined amplitude and phase and (ii) the Q-side signal output section 26 outputs the Q-component signal corresponding to the Q-component data having the predetermined amplitude and phase.

The control section 52 causes an external signal oscillator or the like to output a periodic signal, and causes the periodic signal to be quadrature modulated with the I-component signal and the Q-component signal. More specifically, the control section 52 multiplies the I-component signal by a sine signal having the same period as the periodic signal, multiplies the Q-component signal by a cosine signal having a phase delayed by 90 degrees from that of the sine signal, and outputs an output signal obtained by adding together the resulting signals.

The low-pass filter 54 receives the output signal from the quadrature modulator 28. The low-pass filter 54 removes a component having a frequency higher than that of a signal component of the periodic signal from the output signal of the quadrature modulator 28, and supplies the resulting signal to the measuring section 56. If the quadrature modulator 28 is provided with the low-pass filter for shaping the waveform at the output stage, the calibration section 36 need not include the low-pass filter 54.

The measuring section 56 measures the output signal of the quadrature modulator 28. More specifically, the measuring section 56 measures the power of the high-frequency component of the periodic signal in the output signal of the quadrature modulator 28. In the present embodiment, the measuring section 56 detects the power of the output signal passed through the low-pass filter 54 using a power detector or the like. Instead, the measuring section 56 may measure the power of the high-frequency component of the periodic signal using a spectrum analyzer or the like.

Figure 6:
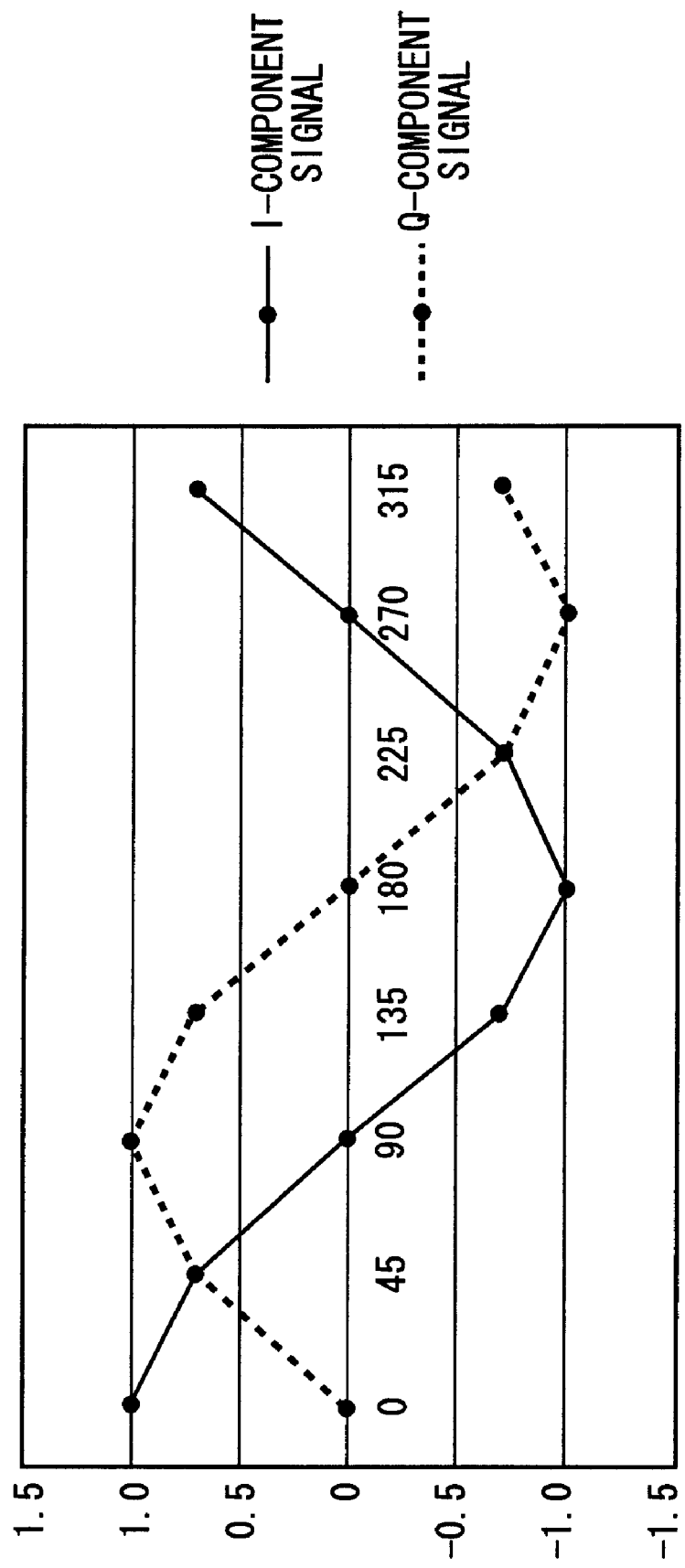
FIG. 6 shows examples of the I-component signal output from the I-side signal output section 24 and the Q-component signal output by the Q-side signal output section 26 during calibration.
Figure 7:
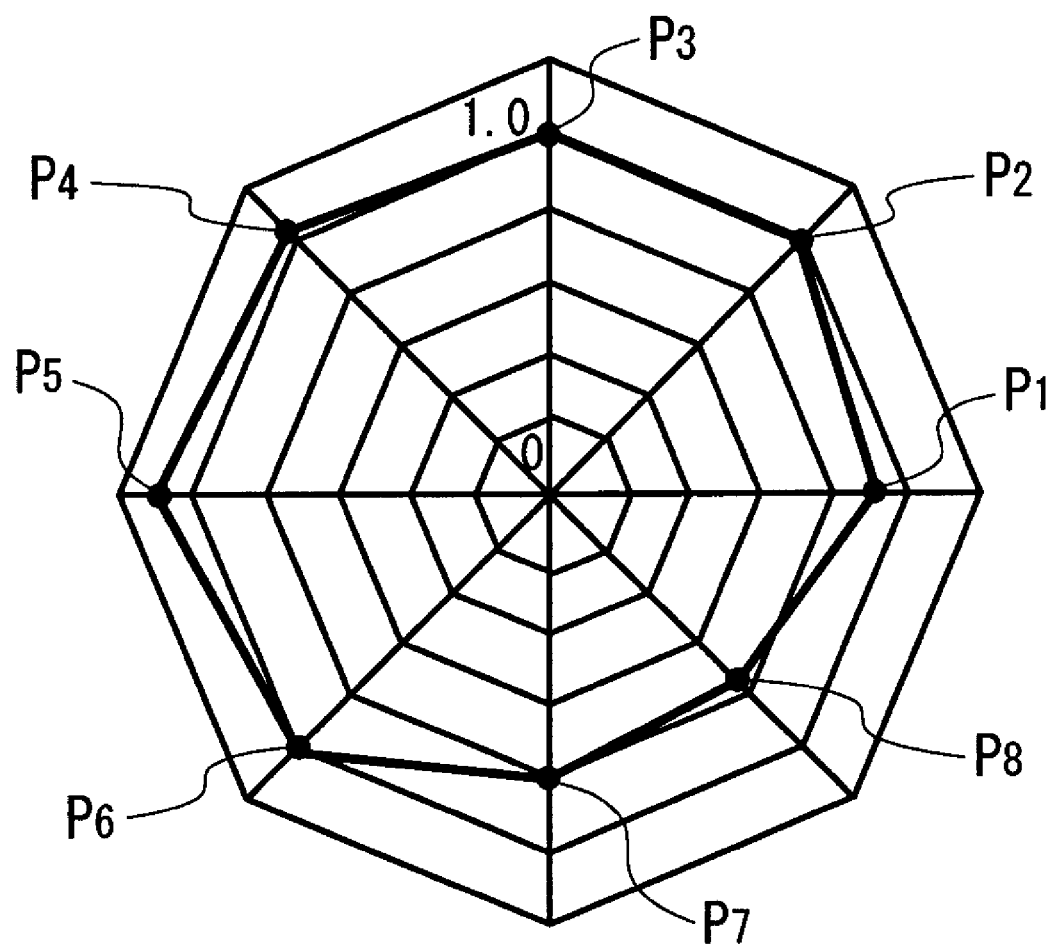
FIG. 7 shows exemplary powers of the output signal corresponding to the I-component signal and the Q-component signal shown in FIG. 6.

The calculating section 58 calculates the error of the quadrature modulator 28 based on the measurement result by the measuring section 56. For example, the calculating section 58 may measure the error of the quadrature modulator 28 by comparing the ideal value of the output signal and the measured value of the output signal. The calculating section 58 may calculate the amplitude error, the quadrature error, and the origin offset of the quadrature modulator 28, for example. FIGS. 6 and 7 describe an exemplary method for measuring the error using the calculating section 58.

The setting section 60 sets the correction amounts corresponding to the calculated error in the I-side correcting section 32 and the Q-side correcting section 34. For example, the setting section 60 sets a correction amount (Gi) corresponding to the I-component of the amplitude error of the quadrature modulator 28 in the I-side correcting section 32, and sets a correction amount (Gq) corresponding to the Q-component of the amplitude error of the quadrature modulator 28 in the Q-side correcting section 34.

The setting section 60 may set a correction amount (p) corresponding to the quadrature error of the quadrature modulator 28 in the I-side correcting section 32. The setting section 60 may set a correction amount (Di) corresponding to the I-component of the origin offset of the quadrature modulator 28 in the I-side correcting section 32, and may set a correction amount (Dq) corresponding to the Q-component of the origin offset of the quadrature modulator 28 in the Q-side correcting section 34.

Figure 5:
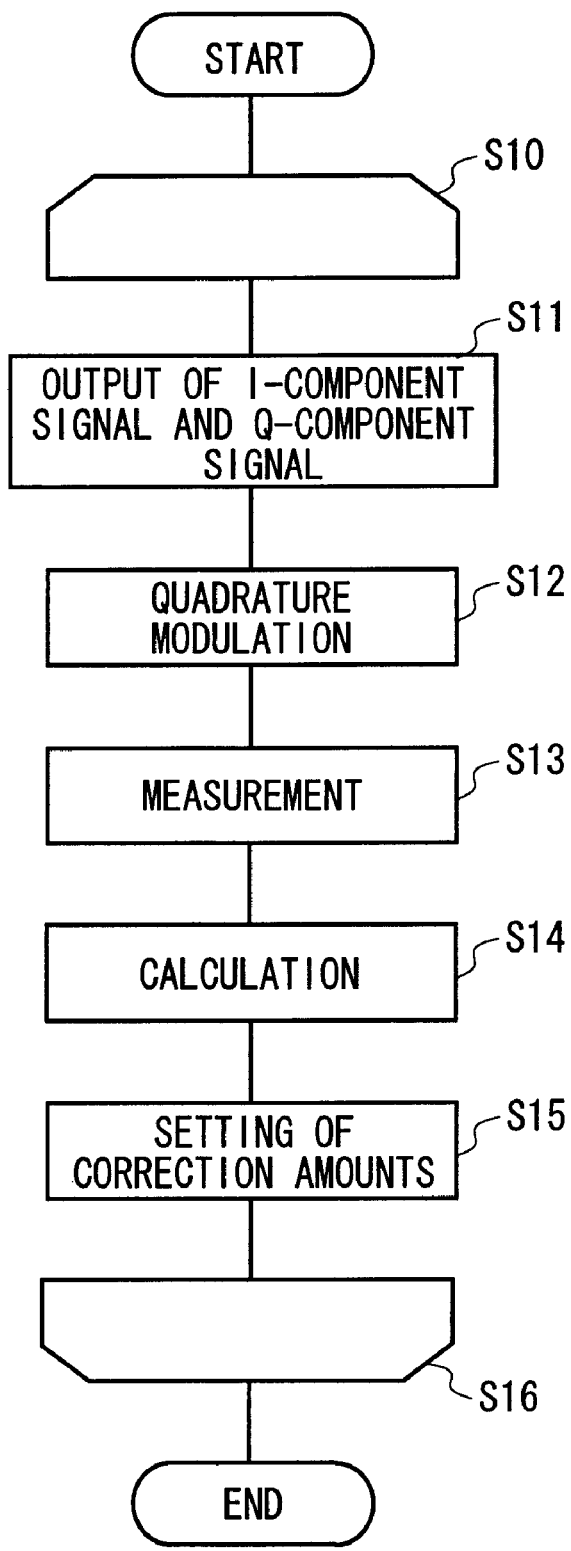
FIG. 5 shows an exemplary process flow of the calibration section 36 according to the present embodiment.

FIG. 5 shows an exemplary process flow of the calibration section 36 according to the present embodiment. Prior to the phase shifting operation of the modulation apparatus 10, the calibration section 36 performs a calibration including steps S10 to S16.

The calibration section 36 performs the process from S11 to S15 one or more times (the loop process between S10 and S16). At step S11, the calibration section 36 causes the I-side signal output section 24 to output an I-component signal corresponding to I-component data having a predetermined amplitude and phase. At the same time, the calibration section 36 causes the Q-side signal output section 26 to output a Q-component signal corresponding to Q-component data having a predetermined amplitude and phase.

At step S12, the calibration section 36 supplies instructions to an external signal generator or the like to cause the output of the periodic signal, and causes the quadrature modulator 28 to quadrature modulate the periodic signal. At step S13, the calibration section 36 measures the output signal from the quadrature modulator 28. At step S14, the calibration section 36 calculates the error of the quadrature modulator 28 based on the measurement result. At step S15, the calibration section 36 sets correction amounts corresponding to the calculated error in the I-side correcting section 32 and the Q-side correcting section 34.

When the process up to step S15 is complete, the process flow returns to step S11. In other words, with the correction amounts being set in the in the I-side correcting section 32 and the Q-side correcting section 34, the calibration section 36 again measures the error of the quadrature modulator 28 by repeating the process from step S11 to step S14.

Then, at step S15, the calibration section 36 updates the correction amounts set in the I-side correcting section 32 and the Q-side correcting section 34 based on the newly measured error. For example, the calibration section 36 adds the correction amounts corresponding to the new measurement result to the correction amounts already set in the I-side correcting section 32 and the Q-side correcting section 34. The calibration section 36 repeats the process from step S11 to step S15 a plurality of times until the error of the quadrature modulator 28 is below a reference value, for example, at which point the calibration process is finished (S16).

By repeating the alternating processes of measuring the error of the quadrature modulator 28 and setting correction amounts, the calibration section 36 can stabilize the fluctuation of the output signal of the quadrature modulator 28. In this way, the calibration section 36 can cause the quadrature modulator 28 to output an output signal that approximates a signal output from an ideal quadrature modulator.

FIG. 6 shows examples of the I-component signal output from the I-side signal output section 24 and the Q-component signal output by the Q-side signal output section 26 during calibration. The calibration section 36 may cause the I-side signal output section 24 and the Q-side signal output section 26 to output the I-component signal corresponding to the I-component data and the Q-component signal corresponding to the Q-component data having amplitudes and phases shown respectively by eight points in FIG. 6. More specifically, the calibration section 36 may cause the I-side signal output section 24 and the Q-side signal output section 26 to output the Q-component signal corresponding to sine values and the I-component signal corresponding to cosine values of phases that are 0, 45, 90, 135, 180, 225, 270, and 315 degrees.

Next, the calibration section 36 modulates the I-component signal and the Q-component signal, corresponding respectively to the eight points of amplitude and phase shown in FIG. 6, with the periodic signal. The calibration section 36 then measures the power of the output signal at each of the eight phases.

FIG. 7 shows exemplary powers of the output signal corresponding to the I-component signal and the Q-component signal shown in FIG. 6. Here, the output signal has a power p1 when the phase is 0, a power p2 when the phase is 45 degrees, a power p3 when the phase is 90 degrees, a power p4 when the phase is 135 degrees, a power p5 when the phase is 180 degrees, a power p6 when the phase is 225 degrees, a power p7 when the phase is 270 degrees, and a power p8 when the phase is 315 degrees.

In this case, the calibration section 36 can calculate the I-component, i.e. the real number component, of the amplitude error of the quadrature modulator 28 as "$m_i$" using Expression 6 shown below. Furthermore, the calibration section 36 can calculate the Q-component, i.e. the imaginary number component, of the amplitude error of the quadrature modulator 28 as "$m_q$" using Expression 7 shown below. In Expressions 6 and 7, "m" represents the ideal amplitude of the output signal.

$$m_i = \frac{p_1 + p_5}{2m} - 1 \qquad \text{Expression 6}$$

$$m_q = \frac{p_3 + p_7}{2m} - 1 \qquad \text{Expression 7}$$

The calibration section 36 can calculate the quadrature error of the quadrature modulator 28 as "$\theta_{re}$" using Expression 8 shown below.

$$\theta_{re} = 2 \times \left( \tan^{-1} \frac{p_4 + p_8}{p_2 + p_6} - \frac{\pi}{4} \right) \quad \text{Expression 8}$$

The calibration section 36 can calculate the I-component, i.e. the real number component, of the origin offset of the quadrature modulator 28 as "$d_i$" using Expression 9 shown below. The calibration section 36 can calculate the Q-component, i.e. the imaginary number component, of the origin offset of the quadrature modulator 28 as "$d_q$" using Expression 10 shown below.

$$d_i = \frac{p_1 - p_5}{2} \quad \text{Expression 9}$$

$$d_q = \frac{p_3 - p_7}{2} \quad \text{Expression 10}$$

Using the above expressions, the calibration section 36 can calculate the amplitude error, the quadrature error, and the origin offset of the quadrature modulator 28. The calibration section 36 is not limited to using the calculation method described above, and may instead calculate the error using a different method.

Figure 8:
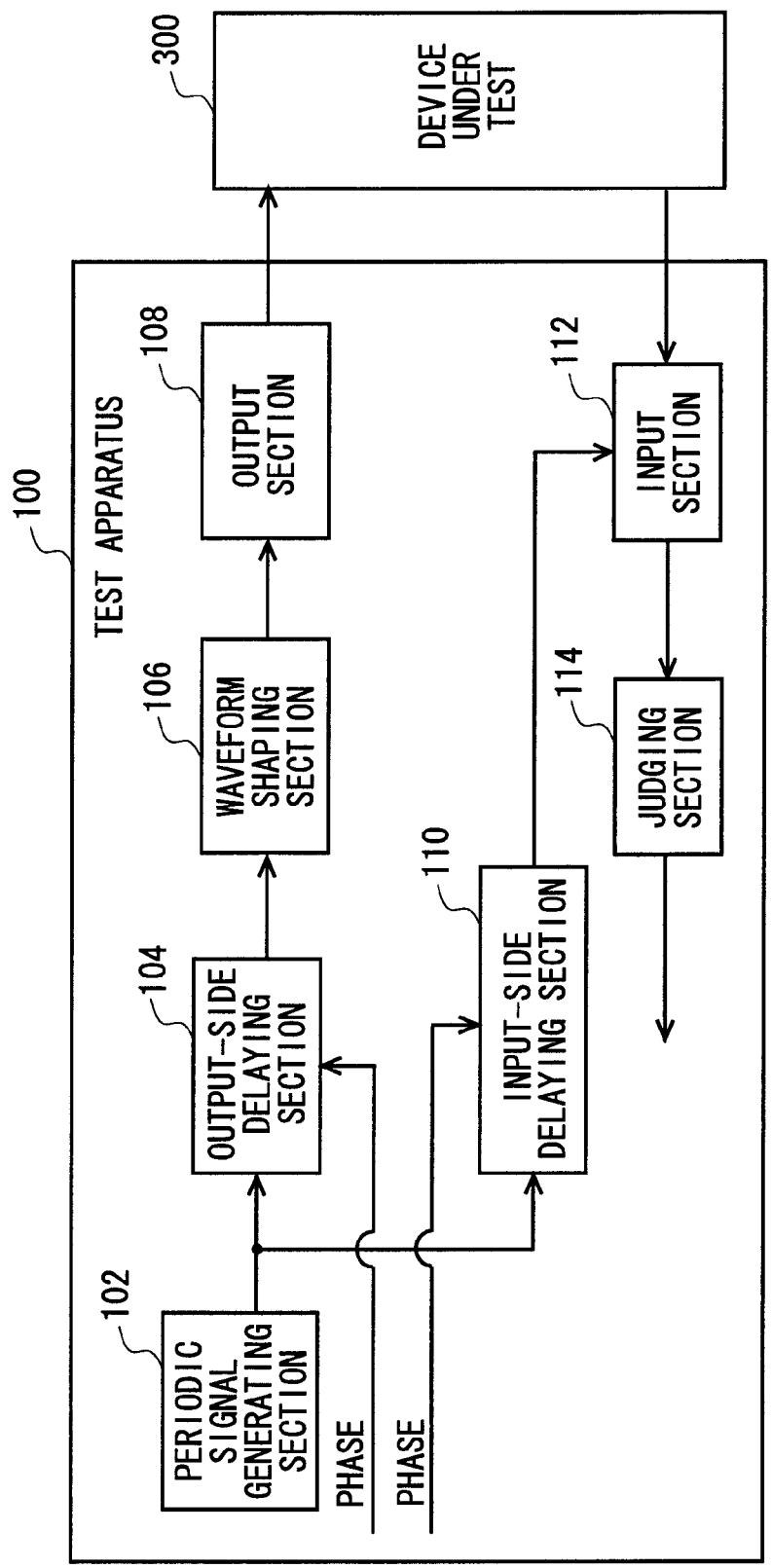
FIG. 8 shows a configuration of a test apparatus 100 according to an embodiment of the present invention.

FIG. 8 shows a configuration of a test apparatus 100 according to an embodiment of the present invention. The test apparatus 100 tests a device under test 300. The test apparatus 100 is provided with a periodic signal generator 102, an output-side delaying section 104, a waveform shaping section 106, an output section 108, an input-side delaying section 110, an input section 112, and a judging section 114.

The periodic signal generator 102 generates a periodic signal having a designated period and supplies the periodic signal to the output-side delaying section 104 and the input-side delaying section 110. The output-side delaying section 104 shifts the phase of the periodic signal supplied from the periodic signal generator 102 by a designated phase amount.

The waveform shaping section 106 shapes a waveform of the test signal supplied to the device under test 300 based on the periodic signal whose phase is shifted by the output-side delaying section 104. More specifically, the waveform shaping section 106 shapes a waveform having a pattern designated by a pattern generator, at a timing of the periodic signal whose phase is shifted by the output-side delaying section 104. The output section 108 supplies the device under test 300 with the signal having the waveform shaped by the waveform shaping section 106 as a test signal.

The input-side delaying section 110 shifts the phase of the periodic signal supplied from the periodic signal generator 102 by a designated phase amount. The input section 112 receives a response signal output from the device under test 300 based on the periodic signal whose phase is shifted by the input-side delaying section 110. More specifically, the input section 112 acquires a logic value of the response signal output by the device under test 300 at a timing of the periodic signal whose phase is shifted by the input-side delaying section 110. The judging section 114 judges acceptability of the device under test 300 by comparing the value of the response signal output by the input section 112 to an expected value designated by the pattern generator.

Here, the output-side delaying section 104 and the input-side delaying section 110 may have the same configuration as the modulation apparatus 10 according to the embodiments described in relation to FIGS. 1 to 7. In this case, a constant amplitude is designated so that the modulation apparatus 10 functions as a phase shifting apparatus. Accordingly, the output-side delaying section 104 and the input-side delaying section 110 can accurately shift the phase of a high-frequency periodic signal. In this way, the test apparatus 100 can accurately test the device under test 300 that includes a high-speed input/output interface.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A modulation apparatus that quadrature modulates a periodic signal, comprising:
    an I-side signal output section that outputs an I-component signal;
    a Q-side signal output section that outputs a Q-component signal;
    a quadrature modulator that quadrature modulates the periodic signal with the I-component signal and the Q-component signal;
    an I-side correcting section that corrects the I-component signal according to an error of the quadrature modulator;
    a Q-side correcting section that corrects the Q-component signal according to the error of the quadrature modulator; and
    a calibration section that measures the error of the quadrature modulator and sets correction amounts corresponding to the measured error in the I-side correcting section and the Q-side correcting section, the calibration section including:
        a control section that causes the I-side signal output section to output a predetermined I-component signal, causes the Q-side signal output section to output a predetermined Q-component signal, and causes the quadrature modulator to perform quadrature modulation;
        a measuring section that measures power of the output signal from the quadrature modulator;
        a calculating section that calculates a quadrature error, a gain error, and an origin offset of the quadrature modulator based on the measurement result from the measuring section; and
        a setting section that sets correction amounts corresponding to the calculated errors in the I-side correcting section and the Q-side correcting section.

2. The modulation apparatus according to claim 1, wherein
the I-side correcting section corrects I-component data supplied thereto, according to the error of the quadrature modulator,
the I-side signal output section outputs the I-component signal corresponding to the I-component data corrected by the I-side correcting section,
the Q-side correcting section corrects Q-component data supplied thereto, according to the error of the quadrature modulator, and
the Q-side signal output section outputs the Q-component signal corresponding to the Q-component data corrected by the Q-side correcting section.

3. The modulation apparatus according to claim 2, wherein
the I-side correcting section corrects gain of the I-component data according to an I-component of an amplitude error of the quadrature modulator, and
the Q-side correcting section corrects gain of the Q-component data according to a Q-component of the amplitude error of the quadrature modulator.

4. The modulation apparatus according to claim 2, wherein
at least one of the I-side correcting section and the Q-side correcting section corrects a phase having the I-component data representing a real number component thereof and the Q-component data represent an imaginary number component thereof, according to a quadrature error of the quadrature modulator.

5. The modulation apparatus according to claim 2, wherein
the I-side correcting section corrects an offset added to the I-component data, according to an I-component of an origin offset of the quadrature modulator, and
the Q-side correcting section corrects an offset added to the Q-component data, according to a Q-component of the origin offset of the quadrature modulator.

6. The modulation apparatus according to claim 1, wherein
with the correction amounts being set in the I-side correcting section and the Q-side correcting section, the calibration section again measures the errors of the quadrature modulator and updates the correction amounts set in the I-side correcting section and the Q-side correcting section according to the newly measured errors.

7. The modulation apparatus according to claim 1, wherein
the calibration section further includes a low-pass filter that removes a component having a frequency higher than that of a signal component of the periodic signal, from the output signal of the quadrature modulator, and supplies the resulting signal to the measuring section.

8. A test apparatus that tests a device under test, comprising:
a periodic signal generator that generates a periodic signal;
the modulation apparatus according to claim 1 that shifts a phase of the periodic signal by a designated phase amount; and
a waveform shaping section that shapes a waveform of a test signal supplied to the device under test, based on the periodic signal having the phase shifted by the modulation apparatus.

9. A method for correcting a quadrature modulator that quadrature modulates a periodic signal, comprising:
supplying the quadrature modulator with a predetermined I-component signal and a predetermined Q-component signal, and causing the quadrature modulator to quadrature modulate the periodic signal with the I-component signal and the Q-component signal;
measuring power of the output signal from the quadrature modulator;
calculating a quadrature error, a gain error, and an origin offset of the quadrature modulator based on the measurement result;
correcting I-component data according to the calculated errors;
correcting Q-component data according to the calculated errors;
supplying the quadrature modulator with an I-component signal corresponding to the corrected I-component data and a Q-component signal corresponding to the corrected Q-component data, and causing the quadrature modulator to quadrature modulate the periodic signal with the I-component signal and the Q-component signal.

* * * * *